US007992673B2

(12) United States Patent
Petrie

(10) Patent No.: US 7,992,673 B2
(45) Date of Patent: Aug. 9, 2011

(54) ON-WALL LOUDSPEAKER AND MOUNTING APPARATUS

(75) Inventor: William Francis Petrie, Ottawa (CA)

(73) Assignee: William Francis Petrie, Ottawa, Ontario (CA)

( * ) Notice: Subject to any disclaimer, the term of this patent is extended or adjusted under 35 U.S.C. 154(b) by 0 days.

(21) Appl. No.: 12/404,415

(22) Filed: Mar. 16, 2009

(65) Prior Publication Data

US 2009/0175485 A1 Jul. 9, 2009

Related U.S. Application Data

(63) Continuation-in-part of application No. 11/461,600, filed on Aug. 1, 2006, now abandoned.

(51) Int. Cl.
*A47B 81/06* (2006.01)
*H05K 5/00* (2006.01)
*H04R 1/02* (2006.01)
*H04R 25/00* (2006.01)

(52) U.S. Cl. ........ 181/199; 181/141; 181/144; 181/150; 381/152; 381/390; 381/395

(58) Field of Classification Search .................. 181/199, 181/150, 144, 141; 381/390, 152, 395
See application file for complete search history.

(56) References Cited

U.S. PATENT DOCUMENTS

| | | | | |
|---|---|---|---|---|
| 4,296,280 | A | 10/1981 | Richie | |
| 4,924,963 | A * | 5/1990 | Polk | 181/144 |
| 5,357,587 | A * | 10/1994 | Grodinsky et al. | 381/414 |
| 5,400,412 | A * | 3/1995 | King et al. | 381/395 |
| 5,537,479 | A * | 7/1996 | Kreisel et al. | 381/96 |
| 6,415,886 | B1 | 7/2002 | Combest | |
| 6,609,589 | B2 * | 8/2003 | Combest | 181/150 |
| 2003/0123679 | A1 | 7/2003 | Dudleston et al. | |
| 2004/0035635 | A1 * | 2/2004 | Nichols et al. | 181/206 |
| 2008/0031486 | A1 * | 2/2008 | Petrie | 381/390 |

* cited by examiner

*Primary Examiner* — Elvin G Enad
*Assistant Examiner* — Christina Russell

(57) ABSTRACT

An on-wall loudspeaker and mounting apparatus includes an enclosure, a loudspeaker driver mounted in the enclosure, brackets of equal length and attachable to a wall, arms of equal length pivotably attached to the brackets and pivotably attached to the enclosure, each arm pivotable perpendicular to the wall. A movement of a cone in the driver is parallel to the pivoting of the arms when an alternating current signal is applied to the driver. The present invention mitigates vibrations transmitted to walls and other building structures, and provides improved means for reproducing low frequencies below a range of conventional loudspeakers.

11 Claims, 6 Drawing Sheets

ON-WALL LOUDSPEAKER AND MOUNTING APPARATUS

CROSS-REFERENCE TO RELATED APPLICATIONS

This application is a CIP (continuation in part) of and claims the benefit of U.S. patent application Ser. No. 11/461,600, filed on 2006 Aug. 1 by the present inventor, which is incorporated herein by reference.

TECHNICAL FIELD

The present invention relates to loudspeakers and in particular to a loudspeaker mountable on a wall and an apparatus for mounting thereon.

BACKGROUND OF THE INVENTION

Currently available media such as CD (compact disc) and DVD (digital video disc) formats that have audio content that exceeds the capabilities of most conventional loudspeakers, especially at lower or bass frequencies. Typical formats such as DTS® (digital theater system) provide 5.1 channels of compressed audio content. An LFE (low frequency effect) channel (the “0.1” channel) may contain audio content as low as 1 Hz. Even after compression and decompression, the sound track may contain substantial amounts of audio energy at ultra low frequencies. Such low frequencies may not be audible to humans but can be felt, and they add to the experience of watching movies of the science fiction, and action/adventure genres. Even though such audio frequencies are difficult to record, they can be easily synthesized and added to movie sound tracks. This is especially popular in movies that present, for example, explosions, earthquakes or dinosaurs as integral content of the movie.

In the future this problem may become worse since new disc formats such as Blu-Ray® and HD-DVD® will provide wider bandwidth and uncompressed audio.

Conventional loudspeakers (such as subwoofers) designed to handle low frequencies require large acoustic volumes and hence require large amounts floor space; making them inconvenient to locate in a home theater room.

As well, conventionally floor-mounted and wall-mounted loudspeaker transfer significant amounts of acoustic energy or vibrations to the wall and other building structures making low-frequencies audible far beyond the home theater room.

Dudleston et al. (U.S. Patent Application 2003/0123679, filed Dec. 31, 2002) provide an “In-Wall Loudspeaker” designed to mount into a building’s interior wall through an opening between two framing studs.

Richie (U.S. Pat. No. 4,296,280, issued Oct. 20, 1981) provides a “Wall Mounted Speaker System” suitable for mounting in the structure of a wall. A mounting assembly adapted for mounting between adjacent wall studs is secured to at least one of the wall studs and receives the speaker enclosure therein.

Combest (U.S. Pat. No. 6,415,886, issued Jul. 9, 2002) provides an apparatus for mounting an audio speaker within a wall such that the apparatus and speaker are attached to and supported by one or more wall studs.

None of the above mentioned loudspeakers and mounting systems mitigate the effects of vibrations transmitted to walls and other building structures nor do they provide means for reproducing low frequencies typically found in LFE channels of popular movies. Clearly, there is a need for an on-wall loudspeaker and mounting apparatus that overcomes the deficiencies of the prior art.

SUMMARY OF THE INVENTION

It is an object of the present invention to provide an on-wall loudspeaker and mounting apparatus that mitigates the vibrations transmitted to walls and other building structures, and provides improved means for reproducing low frequencies below a range of conventional loudspeakers.

The present invention provides an on-wall loudspeaker and mounting apparatus that includes an enclosure, a loudspeaker driver mounted in the enclosure, a plurality of brackets each having a substantially equal length and each having a proximal end attachable to a wall, a plurality of arms each having a top end pivotably attached to a respective distal end of each of the brackets and a bottom end pivotably attached to the enclosure, each arm pivotable in a plane of rotation substantially perpendicular to the wall, and each arm having a substantially equal length. A movement of a cone in the driver is parallel to the planes of rotation of the arms when an alternating current signal is applied to the driver.

The length of the arms is chosen to provide a predetermined resonant frequency of the loudspeaker. The predetermined resonant frequency of the loudspeaker is preferably less than a lower cutoff frequency of the driver. Positions of attachment of the bottom ends of the arms to the enclosure and a center of gravity of the loudspeaker are substantially coplanar. The length of the brackets is chosen to be substantially greater than a distance from the distal end of the bracket to a rear surface of the enclosure plus the length of the arms.

Advantageously, the present invention provides an on-wall loudspeaker and mounting apparatus that mitigates the vibrations transmitted to walls and other building structures, and provides improved means for reproducing low frequencies below a range of conventional loudspeakers.

The foregoing and other features of the invention and advantages of the present invention will become more apparent in light of the following detailed description of the preferred embodiments, as illustrated in the accompanying figures. As will be realized, the invention is capable of modifications in various aspects, all without departing from the invention. Accordingly, the drawings and the description are to be regarded as illustrative in nature, and not as restrictive.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
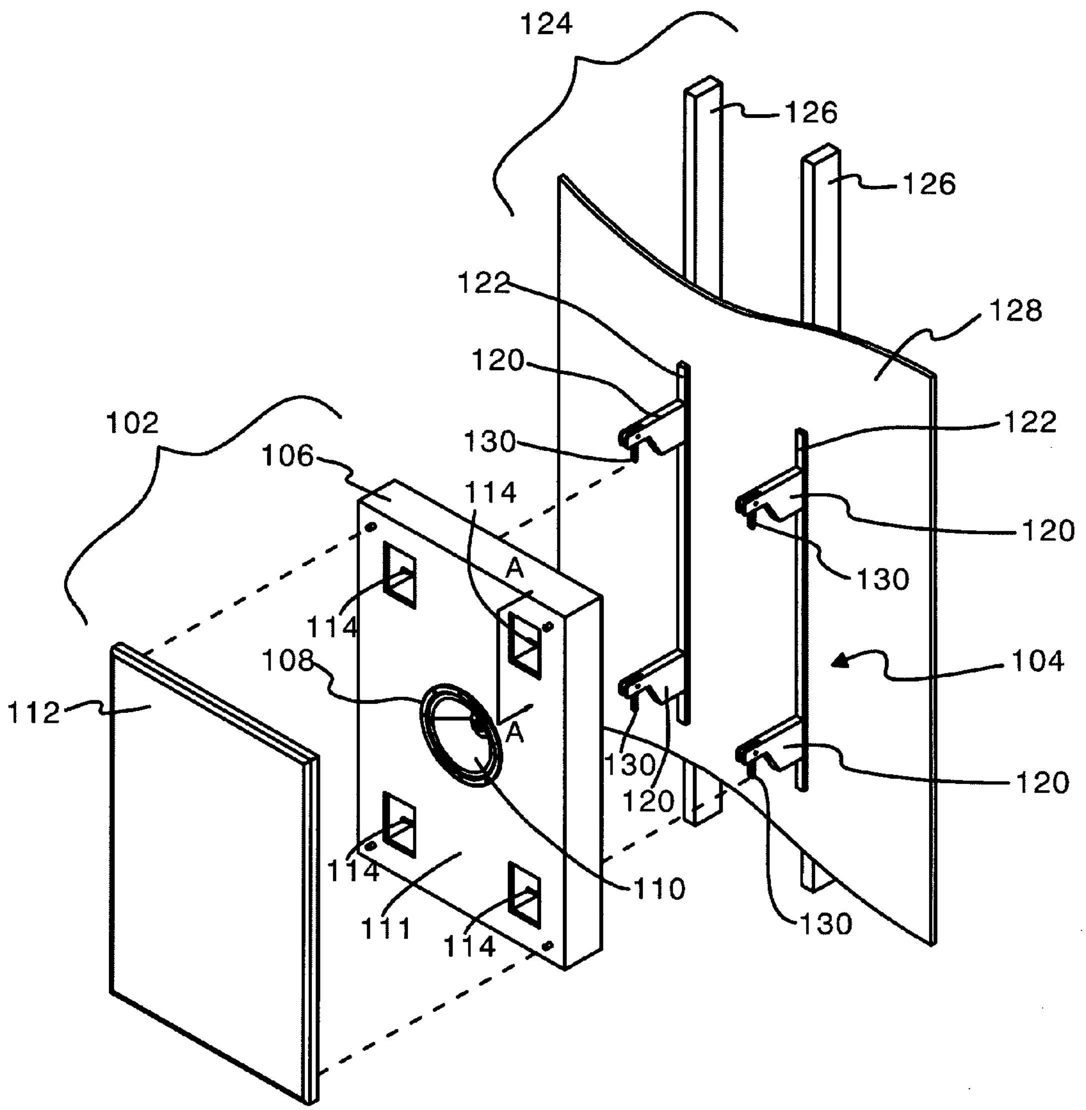
FIG. 1 is an exploded isometric view of an on-wall loudspeaker and mounting apparatus in accordance with the present invention.

In FIG. 1 there is shown an on-wall loudspeaker 102 and mounting apparatus 104 in accordance with the present invention. The loudspeaker 102 includes an enclosure 106 in which there is mounted a loudspeaker driver 108 having a cone 110. A front panel 111 of the enclosure 106 is preferably covered with a loudspeaker speaker grill 112.

It should be noted that a single active driver 108 is shown for convenience and clarity only. The loudspeaker 102 may include multiple active drivers or one or more drones (passive drivers). The enclosure 106 may also include vents and still be within the scope of the invention. Drones and vents (also known as ports) are well known in the art and are used, in part, to extend a low-frequency range of the loudspeaker 102 for a given driver 108.

A volume of the enclosure 106 is chosen using conventional design methods well known in the art. Acoustically, the enclosure 106 may be practically any shape that satisfies the volume requirements. However, for on-wall mounting the enclosure 106 is preferably shallow and wide enough for the mounting apparatus 104 (described herein below) to take advantage of conventionally spaced (16 inches) wall studs 126. However, the enclosure 106 and mounting apparatus 104 may be adapted to take advantage of any type of wall structure that will provide adequate support for the loudspeaker 102.

The enclosure 106 also includes a plurality of pivots 114 for attaching the loudspeaker 102 to the mounting apparatus 104.

The mounting apparatus 104 includes a plurality of brackets 120 that are preferably attachable to vertical tracks 122 that are secured to a wall 124. The brackets 120 preferably include mounting hooks (not shown) for engaging the tracks 122 in a similar manner to conventional track and bracket shelving hardware. The wall 124 preferably includes conventional wood or metal framing studs 126 and drywall 128 or similar material fastened to the studs 126. It should be noted that the brackets 120 may be attached directly to the studs 126 or other structure (not shown) such as a concrete wall or similar structure an still be within the scope of the invention.

The mounting apparatus 104 also includes a plurality of arms 130 each pivotably attached to respective brackets 120 and pivots 114 attached to the enclosure 106. The arms 130 are preferably made of solid metal, cable or elastomeric loop but may be any material that can support the weight of the loudspeaker.

Figure 2:
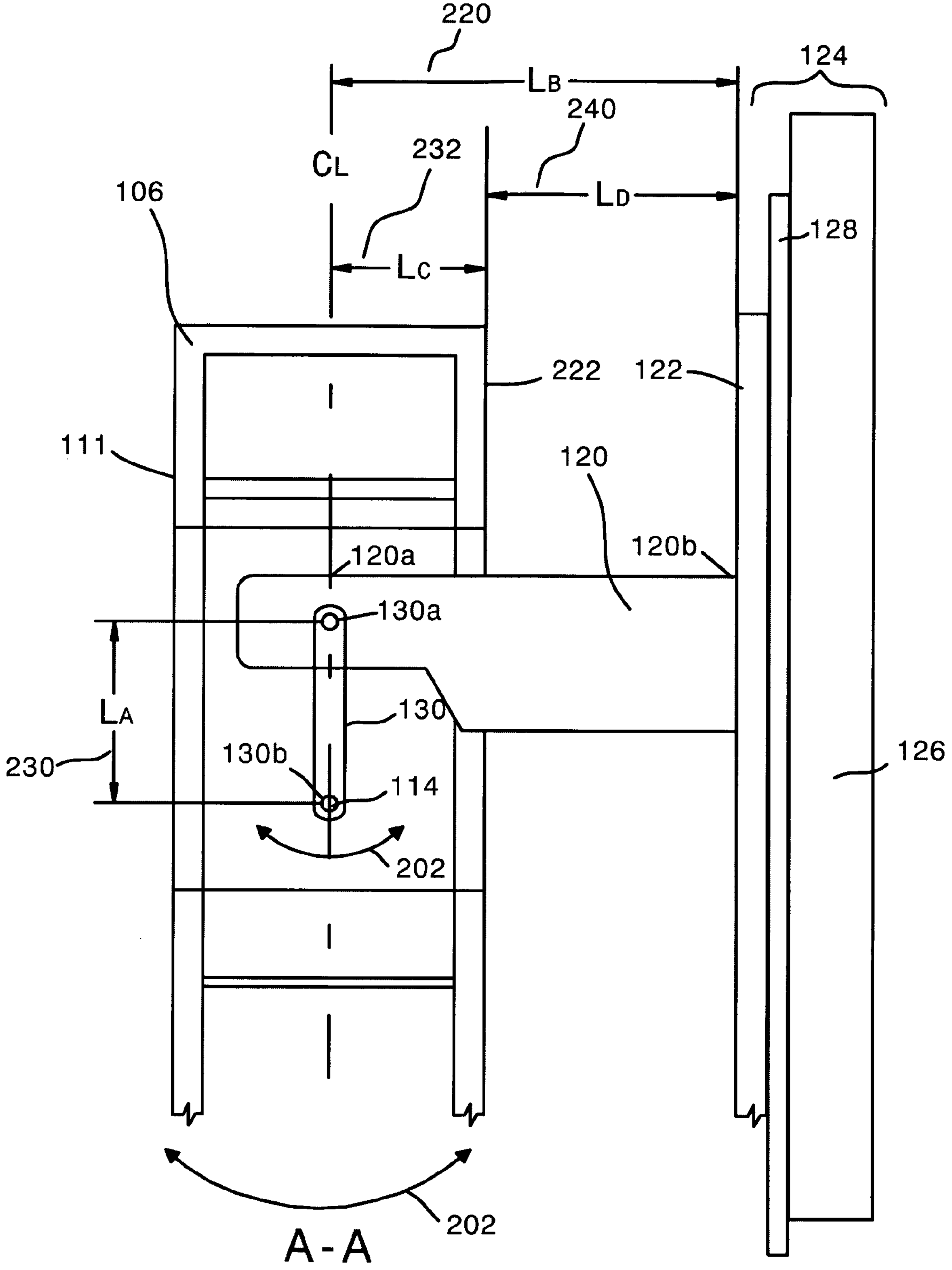
FIG. 2 is a sectional view (A-A) of a portion the on-wall loudspeaker and mounting apparatus shown in FIG. 1.

Referring to FIG. 2 there is shown a partial sectional view (A-A) of the enclosure 106 and mounting apparatus 104 shown in FIG. 1. The arm 130 has a top end 130*a* pivotably attached to a distal end 120*a* of the bracket 120 and a bottom end 130*b* pivotably attached to the pivot 114. The arm 130 is pivotable in a plane of rotation 202 that is substantially perpendicular to the wall 124. Each arm 130 preferably has a substantially equal length ($L_A$) 230.

The length of the arms ($L_A$) 230 is defined as a distance from the center of the pivot point where the top end of the arm 130*a* is pivotably attached to the distal end of the bracket 120*a* to a center of a pivot point where the bottom end of the arm 130*b* is pivotably attached to the pivot 114.

A length ($L_B$) 220 of the brackets 120 is defined as a distance from a center of the pivot point where the top end of the arm 130*a* is pivotably attached to the distal end 120*a* of the bracket 120 to the proximal end 120*b* of the bracket 120.

In operation, the loudspeaker enclosure 102 is mounted on the wall 124 using the mounting apparatus 104. An alternating current (AC) electrical signal is applied to terminals (not shown) of the driver 108, the cone 110 vibrates in accordance with the AC signal producing sound. Since, the vibration or movement of the cone 110 is parallel to the planes of rotation 202, the loudspeaker 102 can swing on the arms 130. Thus transfer of vibration from the loudspeaker 102 to the wall 124 and hence other building structures (not shown) is substantially reduced.

Preferably, the length of the brackets ($L_B$) is chosen such that:

$$L_B > L_A + L_C$$

Where $L_C$ 232 is defined as a distance from the proximal end 120*a* of the bracket 120 to a rear surface of the enclosure 222 when the loudspeaker 102 is at rest. Thus, when the loudspeaker 102 swings to a maximum amplitude, the enclosure 106 will not make contact with the track 122 or wall 124. That is, the length of the arms ($L_A$) 230 is preferably less than a distance $L_D$ 240 from the enclosure 106 to the wall 124. Further aspects of choosing the length of the arms ($L_A$) 230 are described herein below.

Figure 3:
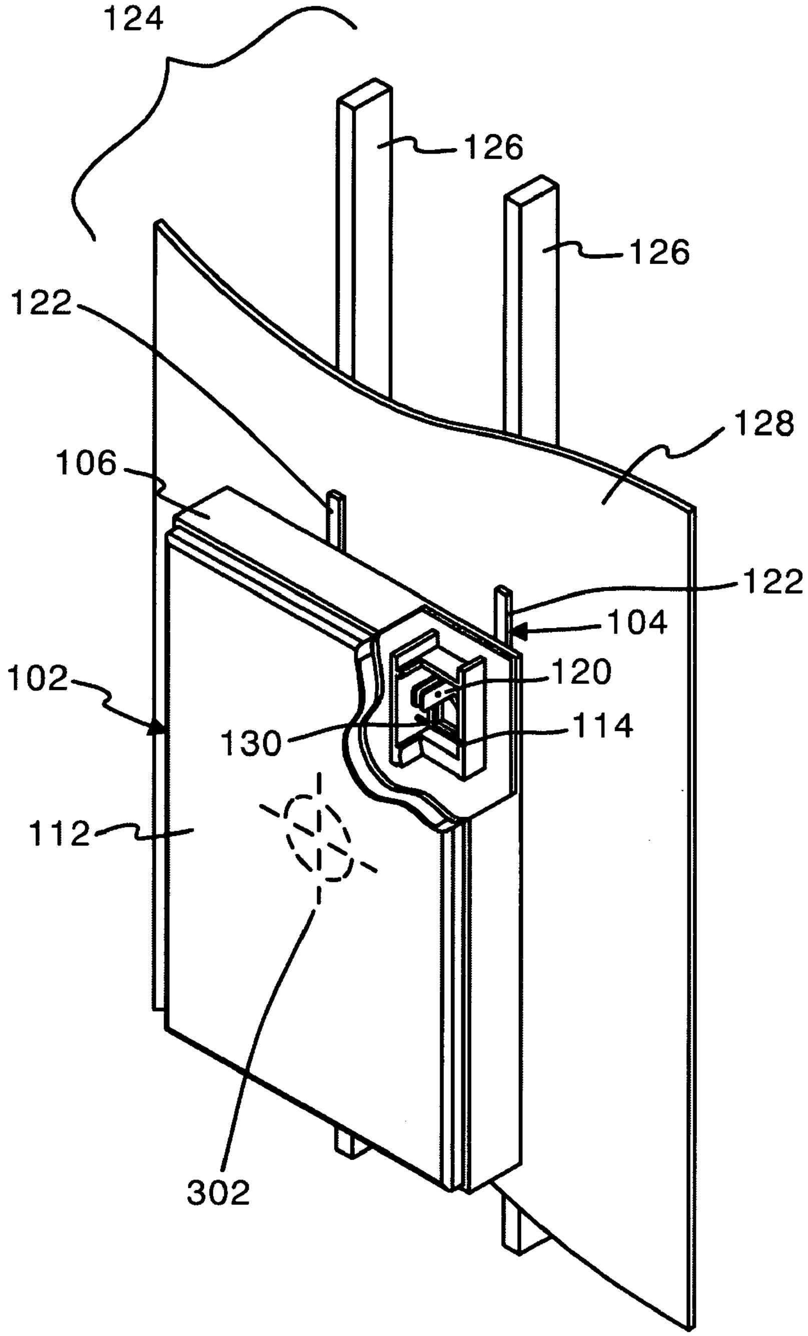
FIG. 3 is an isometric view of an on-wall loudspeaker and mounting apparatus in accordance with the present invention as mounted on a wall structure.

Referring now to FIG. 3, there is shown an isometric view of the loudspeaker 102 mounted on the wall 124 using the mounting apparatus 104. Even though the loudspeaker 102 is shown spanning one stud spacing in the wall 124, the loudspeaker may span a plurality of stud spacings. Also, the loudspeaker 102 is shown having a substantially vertical aspect ratio, the loudspeaker may alternatively have a substantially horizontal aspect ratio to accommodate mounting the loudspeaker 102 in various locations in a room such as below a movie screen or video display (not shown).

Positions of attachment of the bottom ends of the arms 130*b* to the enclosure 106 (also the positions of the pivots) are chosen to be substantially coplanar with a center of gravity 302 of the loudspeaker 102 so that the arms 130 are substantially vertical when the loudspeaker 102 is at rest.

Figure 4:
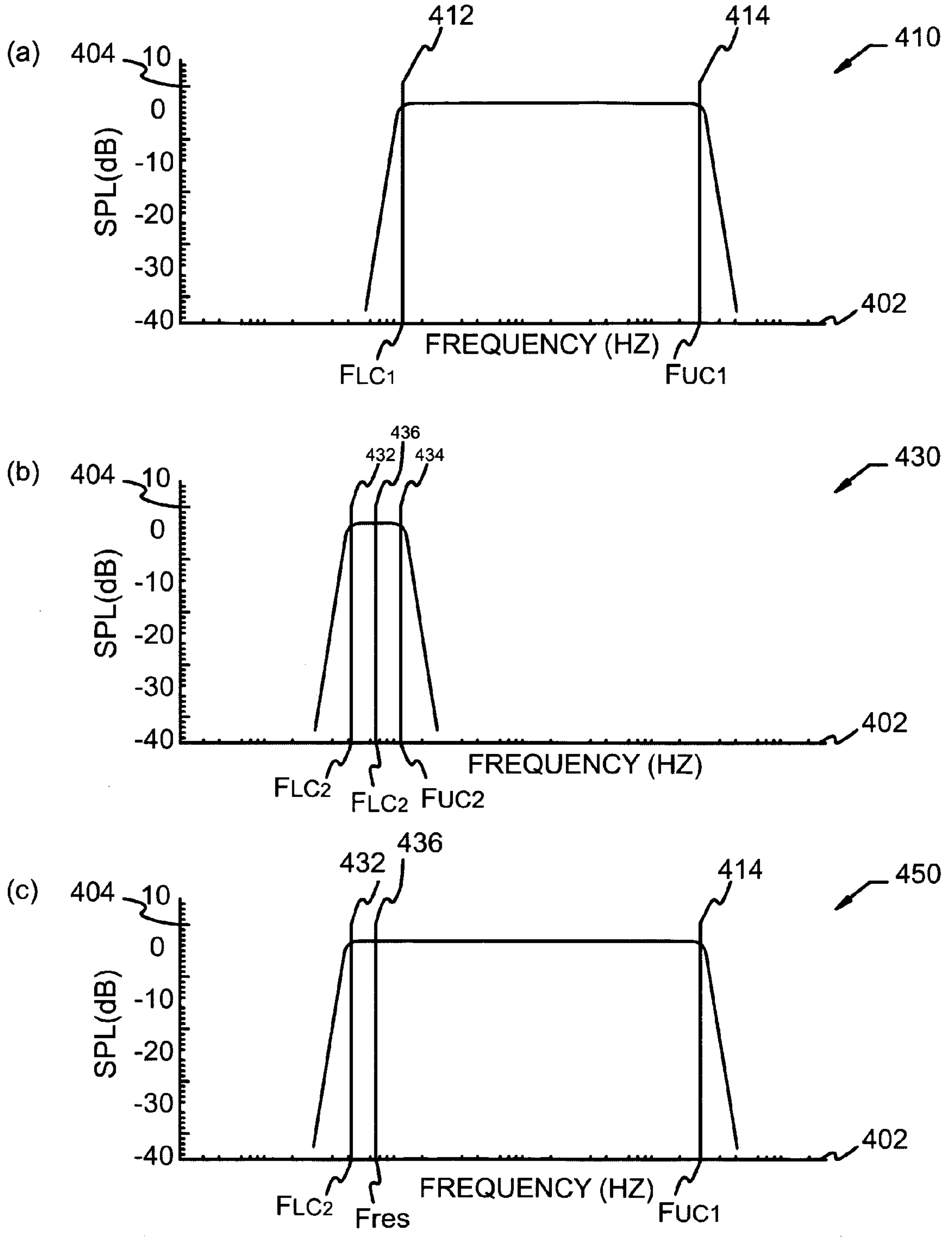
FIGS. 4*a*, 4*b* and 4*c* are plots of SPL (sound pressure level) versus frequency of the on-wall loudspeaker shown in FIGS. 1 to 3.

FIGS. 4*a*, 4*b* and 4*c*, are graphs 410,430,450 of sound pressure level ($dB_{SPL}$) 404 versus frequency (Hz) 402. Idealized frequency responses are shown for clarity only. Those skilled in the art will understand the frequency responses may vary in practice.

Figure 5:
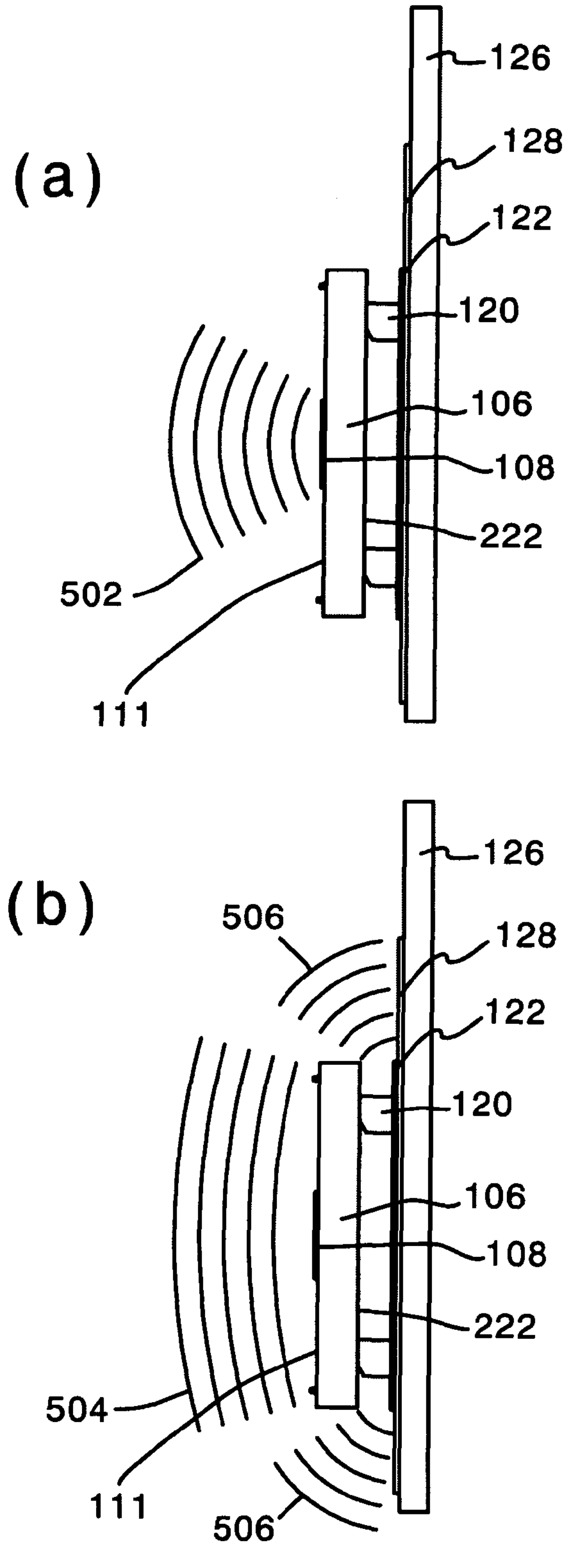
FIGS. 5*a* and 5*b* are side views of the on-wall loudspeaker and mounting apparatus shown in FIGS. 1 to 3 and sound radiation patterns in accordance with the present invention.

FIG. 4*a* is a graph showing a frequency response 410 of the loudspeaker 102. This frequency response 410 covers a range from a lower cutoff frequency ($F_{LC1}$) 412 to an upper cutoff frequency ($F_{UC1}$) 414. For example, $F_{LC1}$ 412 is about 20 to 30 Hz and $F_{UC1}$ 414 is about 80 to 200 Hz for a conventional subwoofer loudspeaker. The frequency response 410 corresponds to sound produced by the driver 108 in a conventional manner. FIG. 5*a* shows a sound radiation pattern 502 from the driver 108.

FIG. 4*b* is a graph showing a frequency response 430 of the loudspeaker 102. This frequency response 430 covers a range from a lower cutoff frequency ($F_{LC2}$) 432 to an upper cutoff frequency ($F_{UC2}$) 434. This frequency response 430 corresponds to sound produced by excursion of the loudspeaker 102 in response to movement of the cone 110 as described herein above. FIG. 5*b* shows respective sound radiation patterns 504,506 for sound produced by movement of the front panel 111 and rear panel 222.

A resonant frequency 436 ($f_{res}$) of the loudspeaker is determine by the length ($L_A$) 230 of the arms 130, as described herein below and is preferably chosen to be lower than the lower cutoff frequency 412 ($F_{LC1}$).

FIG. 4*c* is a graph showing a net frequency response 450 of the loudspeaker 102 including the frequency responses 410, 430 shown in FIGS. 4*a* and 4*b*. This frequency response 450 covers an extended frequency range from $F_{LC2}$ 432 to $F_{UC1}$ 414. Conventional equalization techniques may be used to flatten or emphasize parts this frequency response 410 as desired.

Advantageously, the length 230 of the arms is chosen using the well-known formula for a simple pendulum to be approximately:

$$f_{res} = \frac{1}{2\pi}\sqrt{\frac{g}{L_A}}$$

or $$L_A = \frac{g}{(2\pi f_{res})^2}$$

$$L_A \approx \frac{0.25}{f_{res}^2}$$

where $f_{res}$ (436 in FIG. 4*b*) is the resonant frequency, g is the acceleration of gravity (approximately 9.8 m/s$^2$), and $L_A$ is the length 230 of the arms 130 (*m*).

In conventional loudspeakers a maximum acoustic power at low frequencies is typically limited by the maximum allowable linear excursion of the cone 110 ($x_{max}$). $x_{max}$ is the maximum linear excursion of a driver or passive radiator measured in one direction from its resting position. It is well known in the art that in conventional loudspeakers including one or more active drivers and one or more drones (or vents) cone excursion of the active driver is substantially reduced at resonant frequencies of drones and vents. In a similar manner, the cone excursion of the active driver 108 is substantially reduced at the resonant frequency ($f_{res}$) 436 of the loudspeaker 102 on the mounting system 104.

Another limitation of conventional loudspeakers is that an area of drivers of conventional loudspeakers (not shown) is inadequate to reproduce low-frequencies (such as shown in FIG. 4*b*) given a large amount of air movement required. The present invention overcomes this limitation since an area of the front panel 111 and rear panel 222 is chosen to be substantially greater than the area of conventional drivers and since the front panel 111 and rear panel 222 effectively act as drivers at low-frequencies (as shown in FIG. 5*b*).

Figure 6:
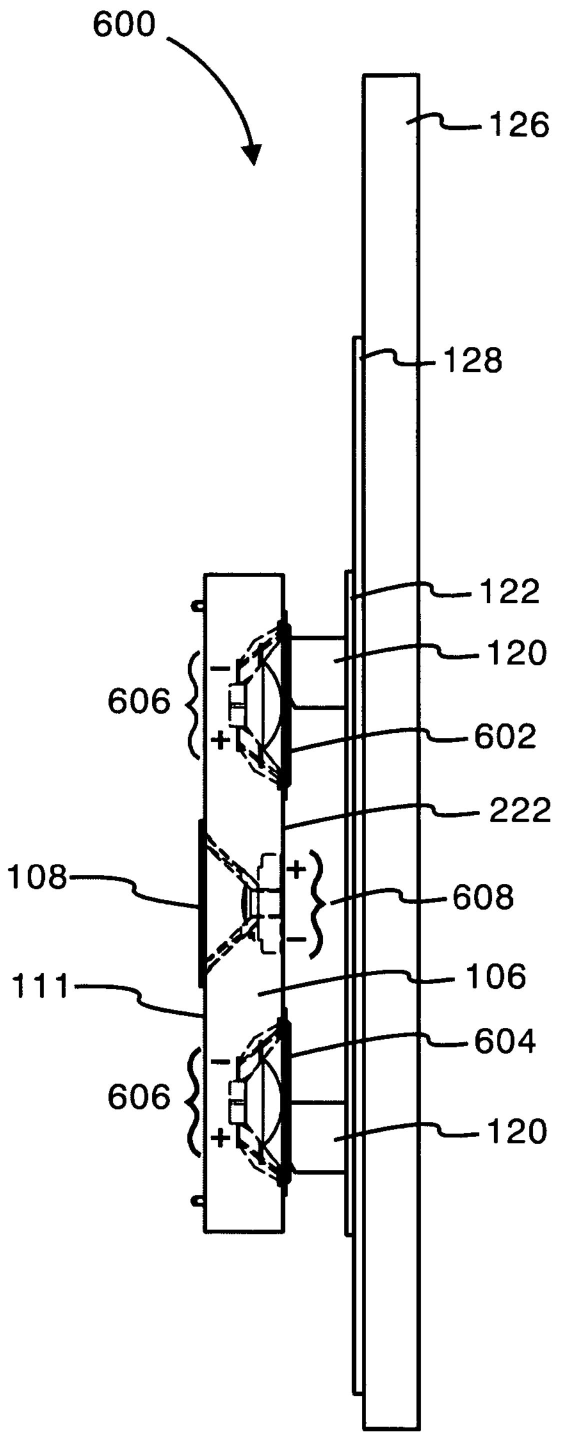
FIG. 6 is a side view of another on-wall loudspeaker and mounting apparatus in accordance with the present invention.

Referring to FIG. 6 there is shown side view of another on-wall loudspeaker and mounting apparatus 600. This embodiment 600 is similar to the embodiment shown in FIGS. 1 to 3 except that one or more opposite drivers 602,604 are mounted on an opposite panel (rear panel 222) from the loudspeaker driver 108 that is mounted on the front panel 111. Two opposite drivers 602,604 are shown and are preferably arranged so that they are symmetrically placed about the center of gravity 302 of the loudspeaker 102 (FIG. 3). However, as noted above with regard to the loudspeaker driver 108, any number of opposite drivers 602,604 may be used and still be within the scope of the present invention.

A preferred arrangement of the loudspeaker driver 108 mounted on the front panel 111 is shown in FIG. 6. However, the loudspeaker driver 108 may be mounted on the real panel 222 with the opposite drivers 602,604 mounted on the front panel 111 and still be within the scope of the present invention.

The opposite drivers 602,604 are preferably drones having a lower resonant frequency than the loudspeaker driver 108.

Alternatively, active drivers may be used for the opposite drivers 602,604. The active drivers are preferably wired so that they have a polarity 606 that is opposite to a polarity 608 of the loudspeaker driver 108 so that a cone of the loudspeaker driver 108 and cones of the opposite drivers 602,604 will move in phase when an AC signal is applied to the terminals (not shown) of the drivers 108,602,604.

Therefore the present invention provides an on-wall loudspeaker that eliminates floor space requirements of conventional loudspeakers while reducing vibrations transferred to wall and other building structures. Furthermore, the present invention also provides a loudspeaker having extended low-frequency capability especially suited for reproducing sound tracks of movies having significant content on an LFE (low frequency effect) channel.

The embodiments of the invention described above are intended to be exemplary only. The scope of the invention is therefore intended to be limited solely by the scope of the appended claims.

Table of Elements

| Reference Number | Element |
|---|---|
| 102 | on-wall loudspeaker |
| 104 | mounting apparatus |
| 106 | enclosure |
| 108 | driver |
| 110 | cone |
| 111 | front panel |
| 112 | grill |
| 114 | pivot |
| 120 | bracket |
| 120a | distal end of bracket |
| 120b | proximal end of bracket |
| 122 | track |
| 124 | wall |
| 126 | stud |
| 128 | drywall |
| 130 | arm |
| 130a | top end of arm |
| 130b | bottom end of arm |
| 202 | plane of rotation |
| 220 | length of bracket ($L_B$) |
| 222 | rear panel |
| 230 | length of arms ($L_A$) |
| 232 | distance from distal end of bracket to rear panel ($L_C$) |
| 240 | distance from enclosure to wall ($L_D$) |
| 302 | center of gravity of the loudspeaker |
| 402 | x-axis representing frequency (Hz) |
| 404 | y-axis representing SPL (dB-SPL) |
| 410 | frequency of driver |
| 412 | lower cutoff frequency of driver ($f_{LC1}$) |
| 414 | upper cutoff frequency of driver ($f_{UC1}$) |
| 430 | frequency response of loudspeaker excursion |
| 432 | lower cutoff frequency of loudspeaker excursion($f_{LC2}$) |
| 434 | upper cutoff frequency of loudspeaker excursion ($f_{UC2}$) |
| 436 | resonant frequency of loudspeaker excursion ($f_{res}$) |
| 450 | net frequency response |

-continued

Table of Elements

| Reference Number | Element |
|---|---|
| 502 | sound radiation pattern from the driver |
| 504 | sound radiation pattern from the front panel |
| 506 | sound radiation pattern from the rear panel |
| 602 | opposite driver |
| 604 | opposite driver |
| 606 | polarity of opposite driver |
| 608 | polarity of loudspeaker driver |

I claim:

1. An on-wall loudspeaker and mounting apparatus comprising:

an enclosure;

a loudspeaker driver mounted in the enclosure;

a plurality of brackets each having a substantially equal length and each having a proximal end attachable to a wall;

a plurality of arms each having a top end pivotably attached to a respective distal end of each of the brackets and a bottom end pivotably attached to the enclosure, each arm pivotable in a plane of rotation substantially perpendicular to the wall, and each arm having a substantially equal length;

whereby a movement of a cone in the driver is parallel to the planes of rotation of the arms when an alternating current signal is applied to the driver;

wherein the length of the arms is chosen to provide a predetermined resonant frequency of the loudspeaker; and wherein the predetermined resonant frequency of the loudspeaker is less than a lower cutoff frequency of the driver.

2. An on-wall loudspeaker and mounting apparatus as claimed in claim 1 wherein positions of attachment of the bottom ends of the arms to the enclosure and a center of gravity of the loudspeaker are substantially coplanar.

3. An on-wall loudspeaker and mounting apparatus as claimed in claim 1 wherein the length of the brackets is chosen to be substantially greater than a distance from the distal end of the bracket to a rear surface of the enclosure plus the length of the arms.

4. An on-wall loudspeaker and mounting apparatus as claimed in claim 1 wherein a type of the arms is selected from a list consisting of: a loop, a cable, an elastomeric member, and a solid metal member.

5. An on-wall loudspeaker and mounting apparatus as claimed in claim 1, wherein an opposite driver is mounted on an opposite panel of the enclosure to the loudspeaker driver.

6. An on-wall loudspeaker and mounting apparatus as claimed in claim 5, wherein the opposite driver is a drone.

7. An on-wall loudspeaker and mounting apparatus as claimed in claim 5, wherein the opposite driver is an active driver having a polarity opposite to a polarity of the loudspeaker driver.

8. A mounting apparatus for mounting an on-wall loudspeaker on a wall, the mounting apparatus comprising:

a plurality of brackets each having a substantially equal length and each having a proximal end attachable to the wall;

a plurality of arms each having a top end pivotably attached to a respective distal end of each of the brackets and a bottom end pivotably attachable to an enclosure of the loudspeaker, each arm pivotable in a plane of rotation substantially perpendicular to the wall, and each arm having a substantially equal length;

whereby a movement of a cone in a driver in the enclosure is parallel to the planes of rotation of the arms when an alternating current signal is applied to the driver;

wherein the length of the arms is chosen to provide a predetermined resonant frequency of the loudspeaker; and wherein the predetermined resonant frequency of the loudspeaker is chosen to be less than a lower cutoff frequency of the driver.

9. A mounting apparatus as claimed in claim 8 wherein positions of attaching the bottom ends of the arms to the enclosure are chosen so that the positions and a center of gravity of the loudspeaker are substantially coplanar.

10. A mounting apparatus as claimed in claim 8 wherein the length of the brackets is chosen to be substantially greater than a distance from the distal end of the bracket to a rear surface of the enclosure plus the length of the arms.

11. A mounting apparatus as claimed in claim 8 wherein a type of the arms is selected from a list consisting of: a loop, a cable, and a solid metal member.

* * * * *